US007459734B2

(12) United States Patent
Joyner et al.

(10) Patent No.: US 7,459,734 B2

(45) Date of Patent: Dec. 2, 2008

(54) METHOD FOR MANUFACTURING AND STRUCTURE FOR TRANSISTORS WITH REDUCED GATE TO CONTACT SPACING

(75) Inventors: Keith A. Joyner, Dallas, TX (US); Mark S. Rodder, University Park, TX (US)

(73) Assignee: Texas Instruments Incorporated, Dallas, TX (US)

(*) Notice: Subject to any disclaimer, the term of this patent is extended or adjusted under 35 U.S.C. 154(b) by 309 days.

(21) Appl. No.: 10/846,741

(22) Filed: May 14, 2004

(65) Prior Publication Data

US 2004/0211992 A1 Oct. 28, 2004

Related U.S. Application Data

(62) Division of application No. 10/068,014, filed on Feb. 5, 2002, now Pat. No. 6,767,777.

(51) Int. Cl.
*H01L 31/062* (2006.01)
*H01L 31/113* (2006.01)

(52) U.S. Cl. ................ 257/288; 257/388; 257/E29.062

(58) Field of Classification Search ................. 438/336, 438/72, 288, 368, 382, 384, 388, 412; 257/384, 257/382, 383, 388, 288, 368, 336, 72, 412, 257/E29.062, E29.243
See application file for complete search history.

(56) References Cited

U.S. PATENT DOCUMENTS 5,757,045 A 5/1998 Tsai et al.
6,013,569 A * 1/2000 Lur et al. .................... 257/288
6,156,654 A * 12/2000 Ho et al. ..................... 438/683
6,165,826 A 12/2000 Chau et al.
6,180,501 B1 1/2001 Pey et al.
6,242,354 B1 * 6/2001 Thomas ............... 257/E21.165
6,545,370 B1 * 4/2003 Ngo et al. ................... 257/384

OTHER PUBLICATIONS

Wolf, Stanley, et al., "Silicon Processing for the VLSI Era," vol. 1, Process Technology, Lattice Press, Sunset Beach, CA, 1986, pp. 144-147, 534.

* cited by examiner

*Primary Examiner*—Walter L Lindsay, Jr.
(74) *Attorney, Agent, or Firm*—Wade James Brady, III; Frederick J. Telecky, Jr.

(57) ABSTRACT

A method for manufacturing a transistor includes providing a transistor assembly having a semiconductor layer with a first surface, a dielectric layer disposed on the first surface, a gate electrode disposed on the dielectric layer, an insulation layer adjacent at least part of the gate electrode, and a nitride spacer layer adjacent at least part of the insulation layer. The method also includes depositing, on part of the first surface, a material that will react with the semiconductor layer to form silicide and removing the unreacted material. The method further includes etching the nitride spacer layer, depositing a pre-metal spacer layer adjacent at least part of the nitride spacer layer and at least part of the first surface, etch removing a portion of the pre-metal spacer layer to expose part of the silicided portion of the first surface, and forming a contact with the silicided portion of the first surface.

11 Claims, 2 Drawing Sheets

300
START
304 FORM NITRIDE LAYER ON GATE STRUCTURE AND A SURFACE OF SEMICONDUCTOR SUBSTRATE
308 REMOVE PORTION OF NITRIDE LAYER TO EXPOSE PORTION OF SURFACE OF SEMICONDUCTOR SUBSTRATE
310 DOPE SEMICONDUCTOR SUBSTRATE AT EXPOSED SURFACE
312 APPLY MATERIAL THAT WILL REACT WITH SEMICONDUCTOR SUBSTRATE TO FORM SILICIDE TO EXPOSED SURFACE OF SEMICONDUCTOR SUBSTRATE
314 ALLOW MATERIAL TO REACT WITH SEMICONDUCTOR SUBSTRATE
316 REMOVE UNREACTED MATERIAL
318 ANNEAL SILICIDED REGION
320 REDUCE WIDTH OF NITRIDE SPACER
322 RINSE TRANSISTOR ASSEMBLY
324 DRY TRANSISTOR ASSEMBLY
326 FORM PMD NITRIDE LAYER ON TRANSISTOR ASSEMBLY
328 FORM PMD OXIDE LAYER ON PMD NITRIDE LAYER
330 REMOVE PORTION OF PMD OXIDE LAYER ABOVE SILICIDED REGION OF SEMICONDUCTOR SUBSTRATE TO EXPOSE PART OF SURFACE OF PMD NITRIDE LAYER
332 REMOVE PORTION OF PMD NITRIDE LAYER BELOW EXPOSED SURFACE TO EXPOSE PART OF SURFACE OF SILICIDED REGION OF SEMICONDUCTOR SUBSTRATE
334 FORM CONTACT WHERE PMD OXIDE LAYER AND PMD NITRIDE LAYER REMOVED
STOP

METHOD FOR MANUFACTURING AND STRUCTURE FOR TRANSISTORS WITH REDUCED GATE TO CONTACT SPACING

This application is a divisional of application Ser. No. 10/068,014, filed Feb. 5, 2002 now U.S. Pat. No. 6,767,777.

TECHNICAL FIELD OF THE INVENTION

This invention relates generally to transistors and, more specifically, to a method for manufacturing transistors.

BACKGROUND OF THE INVENTION

The demand for microprocessors to be made smaller is ever present because size reduction typically increases speed and decreases power consumption. Generally, making microprocessors smaller entails making the components of the microprocessors smaller. Transistors are one of the basic components of microprocessors. Thus, reducing the size of transistors enables microprocessors to be made smaller and, hence, have increased performance.

Transistors are typically manufactured by forming layers of material on top of one another with some type of processing being performed on each layer before depositing the next layer. Because some of the steps in the processing affect the entire device, at some stages of manufacturing, portions of the transistors must have inhibiting materials applied in order to at least retard the effects of certain later manufacturing steps. These inhibiting materials may often be applied to only inhibit the effects of a particular manufacturing step and, thus, may be of limited usefulness after they have served this purpose.

Unfortunately, once these limited purpose inhibiting materials have served their purpose, they may be difficult to remove. For example, since the components of transistors are typically quite small, on the order of a few to a few hundred nanometers—$10^{-9}$ meters, reducing the size of these materials by machining techniques is quite difficult, if not impossible. Moreover, because transistors are typically composed of a variety of materials, the application of an etchant to reduce the size of a particular material is problematic because the etchant tends to dissolve materials that do not require reduction.

SUMMARY OF THE INVENTION

The present invention provides a method that substantially reduces or eliminates at least some of the disadvantages and problems associated with previously developed methods for manufacturing transistors. Accordingly, in certain embodiments, the present invention provides a method that allows an inhibiting material on a transistor to be reduced while having a relatively small effect on the other materials of the transistor. Thus, the inhibiting material may be reduced after serving its primary purpose without significantly affecting the rest of the transistor, resulting in a smaller, yet operational transistor.

In accordance with the present invention, there is provided a transistor assembly including a silicon based semiconductor layer with a first surface. The assembly also includes a dielectric layer disposed on at least part of the first surface and a gate electrode disposed on the dielectric layer. The assembly further includes an insulation layer adjacent at least part of the gate electrode and a nitride spacer layer adjacent at least part of the insulation layer. The method of the present invention includes depositing, on a portion of the first surface, a material that will react with the semiconductor layer to form silicide and removing the unreacted material. The method further includes etching the nitride spacer layer and depositing a pre-metal spacer layer adjacent at least part of the nitride spacer layer and at least part of the silicided portion of the first surface. The method additionally includes etch removing a portion of the pre-metal spacer layer above the silicided portion of the first surface to expose at least part of the silicided portion of the first surface and forming a contact with the exposed part of the silicided portion of the first surface where the pre-metal spacer layer was removed.

A transistor in accordance with the present invention includes a silicon based semiconductor layer having a first surface, at least a portion of the semiconductor layer adjacent the first surface having been silicided. The transistor also includes a dielectric layer disposed on at least part of the first surface and a gate electrode disposed on the dielectric layer. The transistor further includes an insulation layer adjacent at least part of the gate electrode and a nitride spacer layer adjacent at least part of the insulation layer. The distance from an edge of the gate electrode to the beginning of the silicided portion of the semiconductor layer is greater than the distance from the edge of the gate electrode to the edge of the nitride spacer layer closest the silicided portion.

The present invention allows the contacts of a transistor to be placed relatively close to the gate. This spacing allows the transistor to be made smaller, thereby providing increased speed and decreased power consumption in operation of the transistor, and any products into which it is incorporated, such as a microprocessor. Moreover, the present invention allows the transistor to be made smaller without significantly sacrificing performance characteristics of the transistor, such as current leakage between the source and the gate or the conductive characteristics of the semiconductor material. Thus, even though a transistor manufactured according to the present invention are smaller, at least certain performance characteristics may be comparable to those of larger transistors. The transistor may be made smaller through the use of standard manufacturing techniques, thereby allowing the transistor, and any resulting products into which it is incorporated, to be manufactured without a significant increase in cost over conventional transistors. Certain embodiments may possess none, one, some, or all of these technical features and advantages and/or additional technical features and advantages.

Other technical features and advantages will be readily apparent to one of skill in the art from the following figures, description, and claims.

BRIEF DESCRIPTION OF THE DRAWINGS

To provide a more complete understanding of the present invention, especially when considered in light of the following written description, and to further illuminate its technical features and advantages, reference is now made to the following drawings, in which.

DETAILED DESCRIPTION OF THE INVENTION

Figure 1:
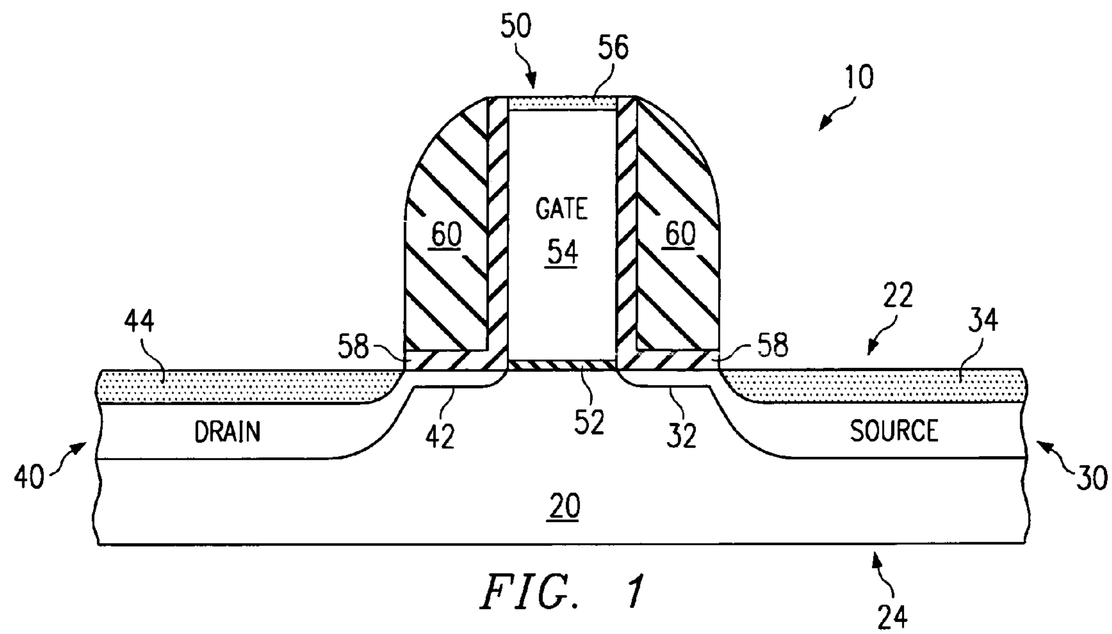
FIG. 1 illustrates a transistor assembly at one stage of a manufacturing process in accordance with the present invention.

FIG. 1 illustrates a transistor assembly 10 at one stage of a manufacturing process in accordance with the present invention. In general, transistor assembly 10 includes a semiconductor layer 20, a source region 30 formed in semiconductor layer 20, a drain region 40 formed in semiconductor layer 20, a gate structure 50, and a spacer layer 60.

Semiconductor layer 20 may be a substrate, such as, for example, a wafer, and may be composed of any appropriate type of semiconductive material. In the illustrated embodiment, semiconductor layer 20 is composed of single crystalline silicon and has a first surface 22 and a second surface 24. Semiconductor layer 20 may also be a layer of semiconductive material formed on a substrate. For example, semiconductor layer 20 may be an epitaxial layer grown on a wafer. Semiconductor layer 20 forms a base for the other components of transistor assembly 10 and also serves as a semiconductive material.

Semiconductor layer 20 includes a source region 30. Source region 30 facilitates the flow of electrons through semiconductor layer 20. Source region 30 may be formed in semiconductor layer 20 by doping that particular region of semiconductor layer or by any other suitable technique. Doping semiconductor layer 20 may be accomplished by ion implantation, diffusion, or any other suitable process. Doping may cause source region 30 to have an abundance of holes or an abundance of electrons. For example, if boron is used as the dopant, source region 30 will have an abundance of holes, and, on the other hand, if arsenic is used as the dopant, source region 30 will have an abundance of electrons. Accordingly, source region 30 may be either N-type or P-type, and is typically of the opposite type from substrate layer 20. Source region 30 also includes a first portion 32, in which the dopant has not penetrated as far into the semiconductor layer 20, and which acts as a shallow source region for transistor assembly 10.

Source region 30 additionally includes a second portion 34 that has had a material that reacts with semiconductor layer 20 to form silicide applied thereto. In general, the material used to form the silicided region may be any material that reacts with the material of the semiconductor layer 20 to form a stable low resistance region. Accordingly, the silicided region facilitates the flow of electrons into source region 30. It is generally thought that metals such as platinum, tungsten, titanium, cobalt, or nickel, are good candidates for reacting with semiconductor layer 20 to form silicide. The material used to form the silicided region may be applied by any of a variety of techniques well known to those skilled in the art. In the illustrated embodiment, cobalt disilicide, $CoSi_2$, has been applied to first surface 22 of semiconductor layer 20. This material reacts with the material of semiconductor layer 20 in a localized area, forming second portion 34. After allowing the material used to form the silicided region to react with the material of semiconductor layer 20, the unreacted material may be removed by applying acid or by any other suitable manner.

Semiconductor layer 20 also includes a drain region 40. Drain region 40 also facilitates the flow of electrons through semiconductor layer 20. Drain region 40 may be formed in semiconductor layer 20 by doping that particular region or by any other suitable technique. Doping semiconductor layer 20 may be accomplished by techniques similar to those used to form source region 30 and typically results in drain region 40 having an abundance of holes or electrons. Accordingly, drain region 40 may be either N-type or P-type. Drain region 40 also includes a first portion 42, in which the dopant has not penetrated as far into the semiconductor layer 20, and which acts as a shallow drain region for transistor assembly 10. Drain region 40 additionally includes a second portion 44, to which a material that will react with semiconductor layer 20 to form silicide has been applied. As mentioned previously, the material used to form the silicided region reacts with the material of semiconductor layer 20 to form a stable low resistance region in drain region 40 and, hence, facilitates the flow of electrons from drain region 40. As with second portion 34 of source region 30, in the illustrated embodiment, second portion 44 of drain region 40 has had cobalt disilicide applied thereto.

As discussed for the illustrated embodiment, source region 30 and drain region 40 may be interchangeable with each other. Thus, source region 30 may behave as a drain region, and drain region 40 may behave as a source region. In other embodiments, however, source region 30 and drain region 40 are not interchangeable.

Transistor assembly 10 also includes a gate structure 50. Gate structure 50 includes a gate dielectric 52, which serves to insulate the rest of gate structure 50 from semiconductor layer 20. Gate dielectric 52 may be formed on part of first surface 22 of semiconductor layer 20 by any of a variety of techniques well known to those skilled in the art and may be composed of any appropriate type of insulating material. In the illustrated embodiment, gate dielectric 52 is composed of nitrided oxide.

Disposed on gate dielectric 52 is a gate electrode 54. Gate electrode 54 may be formed on gate dielectric 52 by any of a variety of techniques well known to those skilled in the art and may be composed of any appropriate conducting material. In the illustrated embodiment, gate electrode 54 is formed of polycrystalline silicon. Moreover, a portion 56 of gate electrode 54 has had some of the material used to form second region 34 applied thereto and, hence, has been silicided. Because portion 56 has been silicided, it provides a low resistance path for electrons to reach gate electrode 54. Gate structure 50 also includes an insulating layer 58 formed adjacent to gate electrode 54, gate dielectric 52, and at least part of first surface 22. Insulating layer 58 serves to insulate gate electrode 54 from the effects of other processing steps on transistor assembly 10 and/or from electrical current during the operation of transistor assembly 10. Insulating layer 58 may be formed adjacent these components of transistor assembly 10 by any of a variety of techniques well known to those skilled in the art. For example, insulating layer 58 may be formed by depositing a film of the insulating material adjacent to first surface 22, gate dielectric 52, and gate electrode 54 and then selectively removing the material, by, for example, applying hydrofluoric acid. Insulating material 58 may be composed of any appropriate material. In the illustrated embodiment, insulating material is composed of oxide.

Transistor assembly 10 additionally includes a spacer layer 60 adjacent at least part of insulating layer 58. Spacer layer 60 may prevent dopant and/or the material that reacts with semiconductor layer 20 to form silicide in second portion 34 and second portion 44 from coming too close to gate electrode 54. Spacer layer 60 may be formed on transistor assembly 10 by any of a variety of techniques well known to those skilled in the art and may be composed of any suitable spacing material. In the illustrated embodiment, spacer layer 60 is composed of nitride and is formed by low pressure chemical vapor deposition (LPCVD).

Although a configuration has been illustrated for transistor assembly 10 in FIG. 1, transistor assembly 10 may have a variety of other configurations. For example, source region 30 and/or drain region 40 do not have be silicided, eliminating second portion 34 and second portion 44, respectively. As another example, source region 30 and drain region 40 do not have to have first portion 32 and first portion 42, respectively, allowing source region 30 and drain region 40 to end well before the edges of gate electrode 54. Moreover, source region 30 and drain region 40 may have a variety of shapes. As a further example, gate structure 50 and spacer layer 60 may have a variety of shapes. A variety of other configurations will be readily suggested to those skilled in the art.

Figure 2:
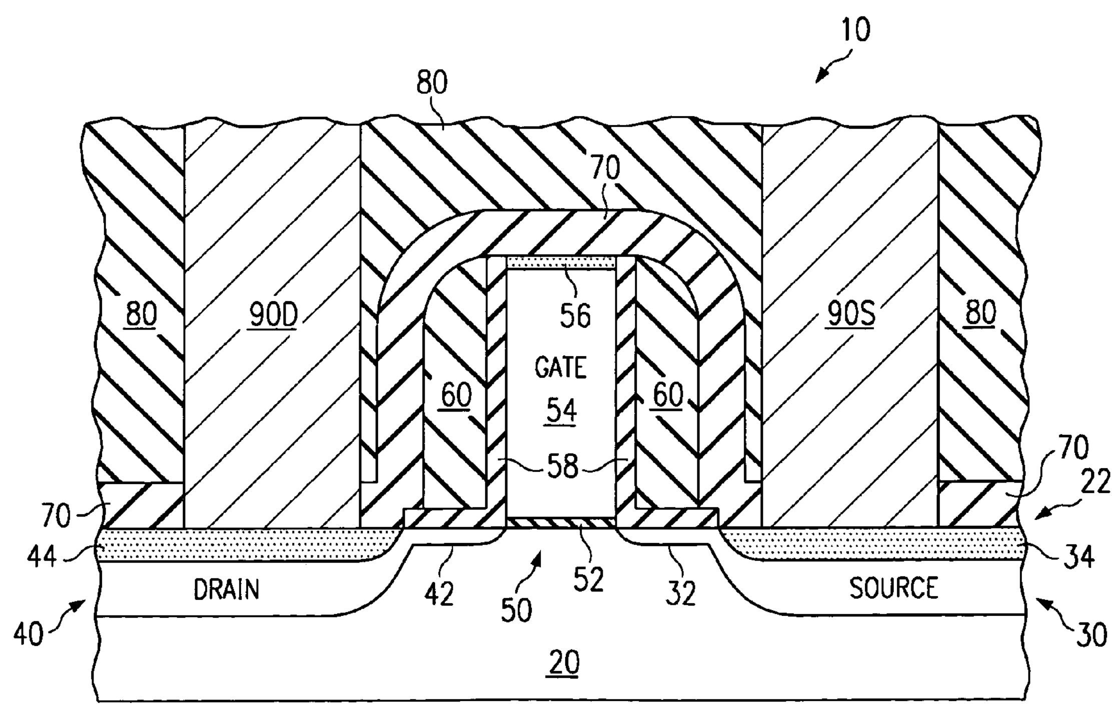
FIG. 2 illustrates the transistor assembly at a second stage of the manufacturing process.

FIG. 2 illustrates transistor assembly 10 at a second stage of the manufacturing process. The elements of transistor assembly 10 previously discussed in FIG. 1 are the same in FIG. 2 except for the fact that spacer material 60 has been reduced in size in FIG. 2. Spacer layer 60 may be reduced in size by an acid etch, a nitride plasma etch, or any other suitable reduction technique. For example, spacer layer 60 may be reduced by placing transistor assembly 10 in a bath of hot phosphoric acid for a given time. The phosphoric acid may be of any suitable concentration. In the illustrated embodiment, transistor assembly 10 was placed into a retort for approximately five minutes with the phosphoric acid heated to 160° C. During this operation, the acid dissolved part of spacer layer 60, part of the material in second portion 34 of source region 30, part of the material in portion 56 of gate electrode 54, and part of the material in second portion 44 of drain region 40. However, the etch rates of phosphoric acid on second portion 34, portion 56, and second portion 44, which are on the order of one nanometer per minute, are generally much less than the etch rate of phosphoric acid on spacer layer 60, which is on the order of five nanometers per minute, allowing a fairly large portion of spacer layer 60 to be removed without removing a significant portion of the other portions. Moreover, reducing spacer layer 60 by using phosphoric acid does not necessarily increase the electrical resistance of second portion 34 and second portion 44 and/or increase the silicide sheet of these portions. For example, for reductions of spacer layer 30 by approximately thirty nanometers, electrical measurements have shown no measurable increase in the silicide sheet for second portion 34 and second portion 44.

Transistor assembly 10 also includes a second spacer layer 70, which acts as an etch stop in a later processing step. Second spacer layer 70 may be formed after reducing spacer layer 60. Second spacer layer 70 may be formed on transistor assembly 10 by any of a variety of techniques well known to those skilled in the art. For example, second spacer layer 70 may be formed by placing transistor assembly 10 in a plasma chamber with a plasma enhanced nitride to form the second spacer layer and then etching where desired. Second spacer layer 70 may be composed of any suitable type of spacing material. In the illustrated embodiment, second spacer layer 70 is composed of pre-metal dielectric (PMD) nitride.

Transistor assembly 10 additionally includes a third spacer layer 80, which acts as a support for contacts to source region 30 and drain region 40, the contacts to be added later in the manufacturing process for transistor assembly 10. Third spacer layer 80 may be formed on transistor assembly 10 after forming second spacer layer 70. Third spacer layer 80 may be formed by any of a variety of techniques well known to those skilled in the art and may be composed of any suitable material. In the illustrated embodiment, third spacer layer 80 is composed of PMD oxide.

Transistor assembly 10 also includes a contact 90S and a contact 90D. Contact 90S facilitates providing electrical current to source region 30 of transistor assembly 10. Contact 90D, in turn, facilitates extracting electrical current from drain region 40. Accordingly, contact 90S and contact 90D may be composed of any acceptable type of electrically conductive material, such as, for example, titanium.

Contact 90S and contact 90D may be formed by any of a variety of techniques well known to those skilled in the art. In the illustrated embodiment, contact 90S and contact 90D are formed by first anisotropically etching third spacer layer 80 over the portion of source region 30 and drain region 40, respectively, where contact 90S and contact 90D are to be placed. The etchant used to remove third spacer layer 80 typically does not remove portions of second spacer layer 70. Second spacer layer 70, therefore, serves to prevent contact 90S and contact 90D from being placed too close to gate electrode 54, which could lead to current leakage or other problems. After the etching of third spacer layer 80 is complete, second spacer layer 70 is anisotropically etched where the material from third spacer layer 80 was removed. The etching of second spacer layer 70 removes the spacer material above the portion of source region 30 and drain region 40 where contact 90S and contact 90D, respectively, are to come into electrical contact with source region 30 and drain region 40. After etching second spacer layer 70, contact 90S and contact 90D may be formed for transistor assembly 10. The actual formation of contact 90S and contact 90D may be accomplished by any of a variety of techniques well known to those skilled in the art.

As illustrated in FIG. 2, a portion, approximately ten nanometers, of third spacer layer 80 lies between contact 90S and contact 90D and second spacer layer 70. Having this portion of third spacer layer 80 between contact 90S and contact 90D and second spacer layer 70 is beneficial because it may be difficult to align the etching used to create the space for contact 90S and contact 90D. In fact, the alignment of contact 90S and contact 90D may vary by approximately fifty nanometers. Thus, for the illustrated embodiment, for the first ten nanometers of misalignment of contact 90S towards gate electrode 54, there is no effect on the size of contact 90S. For misalignments greater than ten nanometers toward gate structure 50, however, contact 90S will probably be reduced in size because the etchant used to remove third spacer layer 80 to form the space for contact 90S will typically not etch second spacer layer 70. Note that without the reduction of spacer layer 60, contact 90S probably could not be placed where it is shown in FIG. 2 and have its full size, assuming the size of second spacer layer 70 is maintained. Moreover, if contact 90S is too small, the transistor resulting from the manufacturing process will not function properly. Thus, the ability to reduce spacer layer 60 allows transistor assembly 10 to be made smaller without having to reduce the size of contact 90S and also allows more transistors to be of acceptable quality.

Although a particular configuration has been illustrated for transistor assembly 10 in FIG. 2, transistor assembly 10 may have a variety of other configurations. For example, transistor assembly 10 may not require second spacer layer 70. Thus, after reducing spacer layer 60, third spacer layer 80 may be applied and contact 90S and contact 90D formed in that layer alone. As another example, contact 90S and contact 90D may be placed farther from or closer to gate structure 50. In general, the edges of contact 90S and contact 90D closest to the respective edge of gate electrode 54 will be between approximately forty to one-hundred and fifty nanometers from the respective edge of gate electrode 54. A variety of other configurations will be readily suggested to those skilled in the art.

Transistor assembly 10 may also have a variety of configurations depending on the size of its components. In the embodiment illustrated in FIG. 1, semiconductor layer 20 is approximately one-hundred and sixty nanometers in height, and source region 30 and drain region 40 are approximately eighty nanometers in height. Additionally, second portion 34 of source region 30 and second portion 44 of drain region 40 are approximately thirty nanometers in height. For gate structure 50, gate dielectric 52 is approximately ten nanometers in height and one-hundred nanometers in width. Gate electrode

54 is, accordingly, approximately one-hundred nanometers in width and is approximately one-hundred and ninety nanometers in height. Insulating layer 58 is approximately fifteen nanometers in width. Spacer layer 60 is approximately eighty nanometers in width and one-hundred and eighty-five nanometers in height.

In FIG. 2, spacer layer 60 has been reduced from approximately eighty nanometers in width to approximately fifty nanometers in width. Second spacer layer 70 is approximately thirty nanometers in width at its narrowest point and two-hundred and thirty nanometers in height at its tallest point. Additionally, third spacer layer 80 is approximately seven-hundred and seventy nanometers in height at its tallest point, and contact 90S and contact 90D are approximately one-hundred and sixty nanometers in width and eight-hundred nanometers in height.

As can be seen by these measurements, the edge of contact 90S closest to gate electrode 54 and the edge of contact 90D closest to gate electrode 54 are approximately one-hundred nanometers from the respective edges of gate electrode 54. Furthermore, the edge of second portion 34 closest to gate electrode 54 and the edge of second portion 44 closest to gate electrode 54 are approximately one-hundred and thirty nanometers from the respective edges of gate electrode 54. Thus, the material used to keep the silicidation of semiconductor layer 20 away from the edge of gate electrode 54—spacer layer 60—may be reduced in size after it has served its primary purpose. The components of transistor assembly 10 may have a variety of other sizes and, hence, spacings.

As illustrated by FIGS. 1 and 2, and the accompanying description, the present invention has several technical features and advantages. For example, the present invention allows the contacts of a transistor to be placed relatively close to the gate. This spacing allows the transistor to be made smaller, thereby providing increased speed and decreased power consumption during operation of the transistor, and any products into which it is incorporated. As another example, the present invention allows the transistor to be made smaller without significantly sacrificing performance characteristics of the transistor, such as current leakage between the source and the gate or the conductive characteristics of the semiconductor material. This allows the transistor to be made smaller without significantly degrading at least some of its performance characteristics. As an additional example, the transistor may be made smaller through the use of conventional, although not necessarily as to order, manufacturing techniques, thereby allowing the transistor, and any resulting products into which it is incorporated, to be manufactured without a significant increase in cost over conventional transistors. Other embodiments may possess none, one, some, or all of these technical features and advantages and/or additional technical features and advantages.

Figure 3:
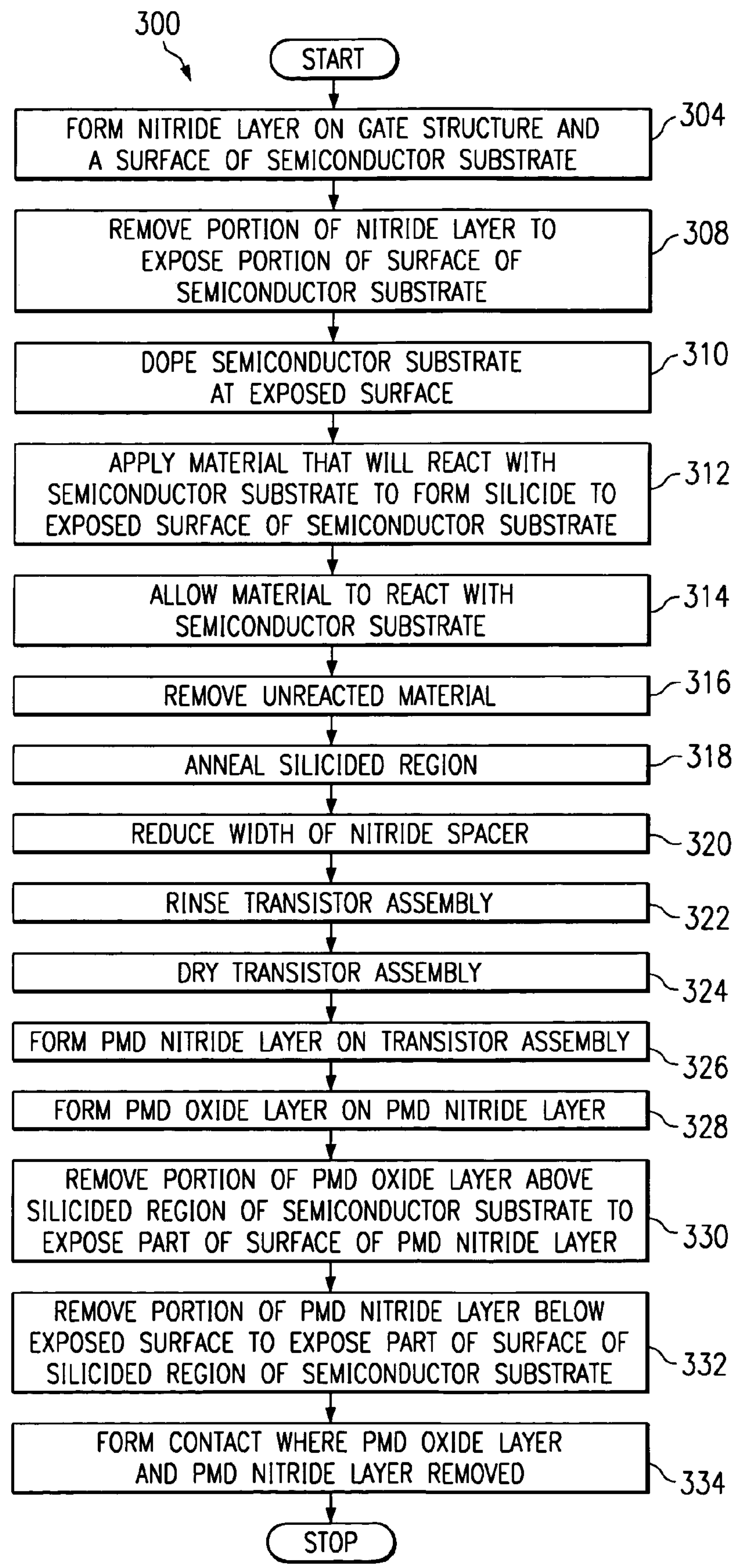
FIG. 3 illustrates a flowchart of the operations for a manufacturing process in accordance with the present invention.

FIG. 3 illustrates a flowchart 300 of the operations of a manufacturing process in accordance with the present invention. For flowchart 300, the gate structure, such as, for example, gate structure 50, is assumed to be already formed on the semiconductor substrate, such as, for example, semiconductor layer 20. At step 304, a nitride layer, such as, for example, spacer layer 60, is formed on at least part of the gate structure and at least part of a surface of the semiconductor substrate, such as, for example, first surface 22. The nitride layer may be formed by any of a variety of techniques well known to those skilled in the art. A portion of the nitride layer is removed to expose a portion of the surface of the semiconductor substrate at step 308. The portion of the nitride layer may be removed by etching or by any other appropriate technique. After exposing the portion of the surface of the semiconductor substrate, the semiconductor substrate is doped at the exposed surface at step 310. Doping may form a source and/or a drain region and may be accomplished by using any of a variety of materials and techniques well known to those skilled in the art. At step 312, a material that will react with the semiconductor substrate to form silicide, such as, for example, cobalt disilicide, is applied to the exposed surface of the semiconductor substrate. Note, the material may also be applied to the nitride layer and the gate structure. The material used to form the silicide may be any appropriate type of substrate reactive, conductive material and may be applied by any of a variety of techniques well known to those skilled in the art. The material is allowed to react with the semiconductor substrate at step 314. The unreacted material is removed at step 316. The unreacted material may be removed by acid or any other appropriate removal technique. Then, the silicided regions are annealed at step 318. Annealing the silicided regions may be accomplished by any of a variety of techniques well known to those skilled in the art.

At step 320, the width of the nitride spacer is reduced. The width of the nitride spacer may be reduced by placing the transistor assembly in hot phosphoric acid or by any other suitable technique. Then, the transistor assembly is rinsed at step 322 and dried at step 324. At step 326, a PMD nitride layer is formed on the transistor assembly. A PMD oxide layer is formed on the PMD nitride layer at step 328. The PMD nitride layer and the PMD oxide layer may be formed by any of a variety of techniques well known to those skilled in the art. At step 330, a portion of the PMD oxide layer above the silicided region of the semiconductor substrate is removed to expose part of the surface of the PMD nitride layer. At step 332, the portion of the PMD nitride layer below the exposed surface of the PMD nitride layer is removed to expose at least part of the surface of the silicided region of the semiconductor substrate. The PMD nitride layer and the PMD oxide layer may be removed by any of a variety of techniques well known to those skilled in the art. At step 334, a contact, such as, for example, contact 90S, is formed where the PMD oxide layer and the PMD nitride layer have been removed.

Although a variety of operations have been discussed with respect to flowchart 300, other embodiments of the present invention may possess only some of these operations and/or additional operations. Moreover, in some embodiments, the operations may occur in a different order. For example, in particular embodiments, the transistor assembly does not have to be silicided. In these embodiments, therefore, the contacts would be in electrical contact with the surface of the doped regions of the semiconductor substrate. As another example, certain embodiments do not require the PMD nitride layer. Thus, there would be no need to form or remove the PMD nitride layer. A variety of other operations and/or ordering of operations will be readily suggested to those skilled in the art.

Although several embodiments of the present invention have been discussed, numerous additions, deletions, substitutions, and/or alterations to the invention may be readily suggested to one of skill in the art without departing from the scope of the appended claims. It is intended therefore that the appended claims encompass such additions, deletions, substitutions, and/or alterations.

What is claimed is:

1. A transistor comprising:

a silicon based semiconductor layer having a first surface, a portion of the semiconductor layer adjacent the first surface having been silicided and a portion unsilicided;

a dielectric layer disposed on at least part of said unsilicided portion of the first surface;

a gate electrode disposed on the dielectric layer;

an insulation layer adjacent at least part of the gate electrode; and an electrically insulating spacer layer adjacent at least part of the insulation layer;

the distance from an edge of the gate electrode to the beginning of the silicided portion of the semiconductor layer is greater than the distance from the edge of the gate electrode to the edge of the electrically insulating spacer layer closest the silicided portion, said silicided portion also spaced from said electrically insulating spacer layer.

2. The transistor of claim 1, wherein the distance between the edge of the electrically insulating spacer layer closest the silicided portion of the semiconductor layer and the beginning of the silicided portion comprises approximately thirty nanometers.

3. The transistor of claim 1, wherein the distance between the edge of the electrically insulating spacer layer closest the silicided portion of the semiconductor layer and the beginning of the silicided portion is formed by etching the electrically insulating spacer layer after forming the silicided portion.

4. The transistor of claim 3, wherein the etchant comprises phosphoric acid at a temperature of approximately one-hundred and sixty degrees Celsius.

5. The transistor of claim 1, wherein the material used to form the silicide comprises $CoSi_2$.

6. The transistor of claim 1, wherein the dielectric layer comprises nitrided oxide.

7. The transistor of claim 1, wherein the gate electrode comprises polycrystalline silicon.

8. The transistor of claim 1, wherein the silicided portion of the semiconductor layer has also been doped.

9. The transistor of claim 1, wherein the distance from the edge of the gate electrode to the beginning of the silicided portion of the semiconductor layer is between approximately fifty and one-hundred and sixty nanometers.

10. The transistor of claim 1, wherein a portion of the gate electrode has been silicided.

11. A transistor comprising:

a silicon based semiconductor layer having a first surface, at least a portion of the semiconductor layer adjacent the first surface having been doped and silicided;

a dielectric layer comprising nitrided oxide disposed on at least part of the first surface;

a gate electrode comprising polycrystalline silicon disposed on the dielectric layer, a portion of the gate electrode having been silicided;

an insulation layer comprising oxide adjacent at least part of the gate electrode; and a spacer layer comprising nitride adjacent at least part of the insulation layer;

wherein the distance between the edge of the spacer layer closest the silicided portion of the semiconductor layer and the beginning of the silicided portion of the semiconductor layer is more than twenty nanometers.

* * * * *